United States Patent [19]
Honsinger et al.

[11] Patent Number: 5,500,804
[45] Date of Patent: Mar. 19, 1996

[54] METHOD TO OPTIMIZE THE WIRING OF MULTIPLE WIRING MEDIA PACKAGES

[75] Inventors: Philip S. Honsinger, Poughkeepsie; Lucy Lim, Wappingers Falls; Vinod Narayanan, Fishkill, all of N.Y.

[73] Assignee: International Business Machines Corporation, Armonk, N.Y.

[21] Appl. No.: 163,979

[22] Filed: Dec. 8, 1993

[51] Int. Cl.⁶ .................................................. G06F 17/50
[52] U.S. Cl. ........................... 364/488; 364/489; 364/490
[58] Field of Search ................................... 364/488–491

[56] References Cited

U.S. PATENT DOCUMENTS

| | | | |
|---|---|---|---|
| 3,702,004 | 10/1972 | Eskew et al. ................................. | 441/1 |
| 4,500,963 | 2/1985 | Smith et al. ............................. | 364/300 |
| 4,791,586 | 12/1988 | Maeda et al. ............................ | 364/491 |
| 4,823,276 | 4/1989 | Hiwatashi ................................ | 364/491 |
| 4,852,015 | 7/1989 | Doyle, Jr. ................................. | 364/491 |
| 4,907,062 | 3/1990 | Fukushima ................................ | 375/75 |
| 5,050,091 | 9/1991 | Rubin ....................................... | 364/488 |
| 5,062,054 | 10/1991 | Kawakami et al. ...................... | 364/491 |
| 5,119,317 | 6/1992 | Narikawa et al. ....................... | 364/512 |
| 5,295,082 | 3/1994 | Chang et al. ............................ | 364/490 |
| 5,375,069 | 12/1994 | Satoh et al. .............................. | 364/490 |

OTHER PUBLICATIONS

Kolman et al., *Elementary Linear Programming with Applications*, Academic Press, 1980, pp. vii–ix; 300–313.
Preas et al., *Physical Design Automation of VLSI Systems*, The Benjamin/Cummings Publishing Company, Inc., 1988, pp. vii–ix.
Lengauer, *Combinatorial Algorithms for Integrated Circuit Layout*, John Wiley & Sons, 1990, pp. vii–xvii; 379; 455.
Linsker, "An iterative improvement penalty–function––driven wire routing system," IBM J. Res. Develop. vol. 28 No. 5, Sep. 1984, pp. 613–624.
Valid Logic Systems Inc., "Allegro–MCM Multi–Chip Module Design System," 1990 (No Page Nos.).
Cooper & Chyan Technology, Inc., "Spectra® Shape–Based Automation", (No Date). (No Page Nos.).
Mentor Graphics Corp., "MCM Station," 1991. (No Page Nos.).
Mentor Graphics Corp., "Board Station 500", 1992. (No Page Nos.).
Iqbal et al., "Design Tradeoffs Among MCM–C, MCM–D and MCM–DIC Technologies," 1993 IEEE Multi–Chip Module Conference, pp. 12–18.

(List continued on next page.)

*Primary Examiner*—Kevin J. Teska
*Assistant Examiner*—Leigh Marie Garbowski
*Attorney, Agent, or Firm*—Whitham, Curtis Whitham & McGinn; Alison D. Mortinger

[57] ABSTRACT

A wiring methodology for optimizing the wiring of multiple wiring media packages. Data models are created for the package and for the networks which embody the circuit design logic of the package. These data models represent the design data and the contrasting electrical and geometrical characteristics of the different media in a form suitable for the operation of wiring algorithms. In the preferred embodiment, one or more constraint models are associated with each wiring network. The electrical properties and availability limits of all wiring resources are included in the data model. The data model is then used in the selection of a rough path for each connection and the assignment of networks and portions of networks to particular media. The rough path serves as a basis for estimates of the characteristics of the wiring solution for each network. Network assignments and estimates are made globally, considering the information for other networks and package design constraints incorporated into the data model. After assignment of media, networks are partitioned into subconnections. Interface via selection is optimized through a process whereby each possible combination between network pins needing vias and available vias is evaluated with respect to a set of costs. Estimates made in prior steps are used to generate these costs. Following via selection, detail routing can then be implemented by segmenting the wiring problem into separate problems for each medium. These separate problems can be resolved sequentially in no particular order.

9 Claims, 4 Drawing Sheets

OTHER PUBLICATIONS

Akihiro et al., "Packaging Technology for the NEC SX-3/SX-X Supercomputer," 1990 40th Annual Conference on Electronic Components, pp. 525–533.

Cho et al., "Multilayer Routing Algorithm for High Performance MCMs," 1992 ASIC Conference and Exhibit, pp. 226–229.

Ho et al., "Layer Assignment for Multichip Modules," IEEE Trans. on Computer–Aided Design, vol. 9. No. 12, Dec. 1990, pp. 1272–1277.

Vemuri et al., "An Integrated Multicomponent Synthesis Environment for MCMs," Computer Magazine, Apr. 1993, pp. 62–74.

Khoo et al., "A Fast Four–Via Multilayer MCM Router," 1993 Multi–Chip Module Conference, pp. 179–184.

Krusius et al., "Analysis of Materials and Structure Tradeoffs in Thin and Thick Film Multi–Chip Packages," 1989 39th Electronic Components Conference, pp. 641–646.

Redmond et al., "Polymide Copper Thin Film Redistribution on Glass Ceramic/Copper Multilevel Substrates," 1991 41st Electronic Components and Technology Conference.

Sriram et al., "Detailed Layer Assignment for MCM Routing," 1992 Int'l Conference on Computer–Aided Design, pp. 386–389.

Tummala et al., "Multichip Packaging—A Tutorial," Proceedings of the IEEE, vol. 80, No. 12, Dec. 1992, pp. 1924–1941.

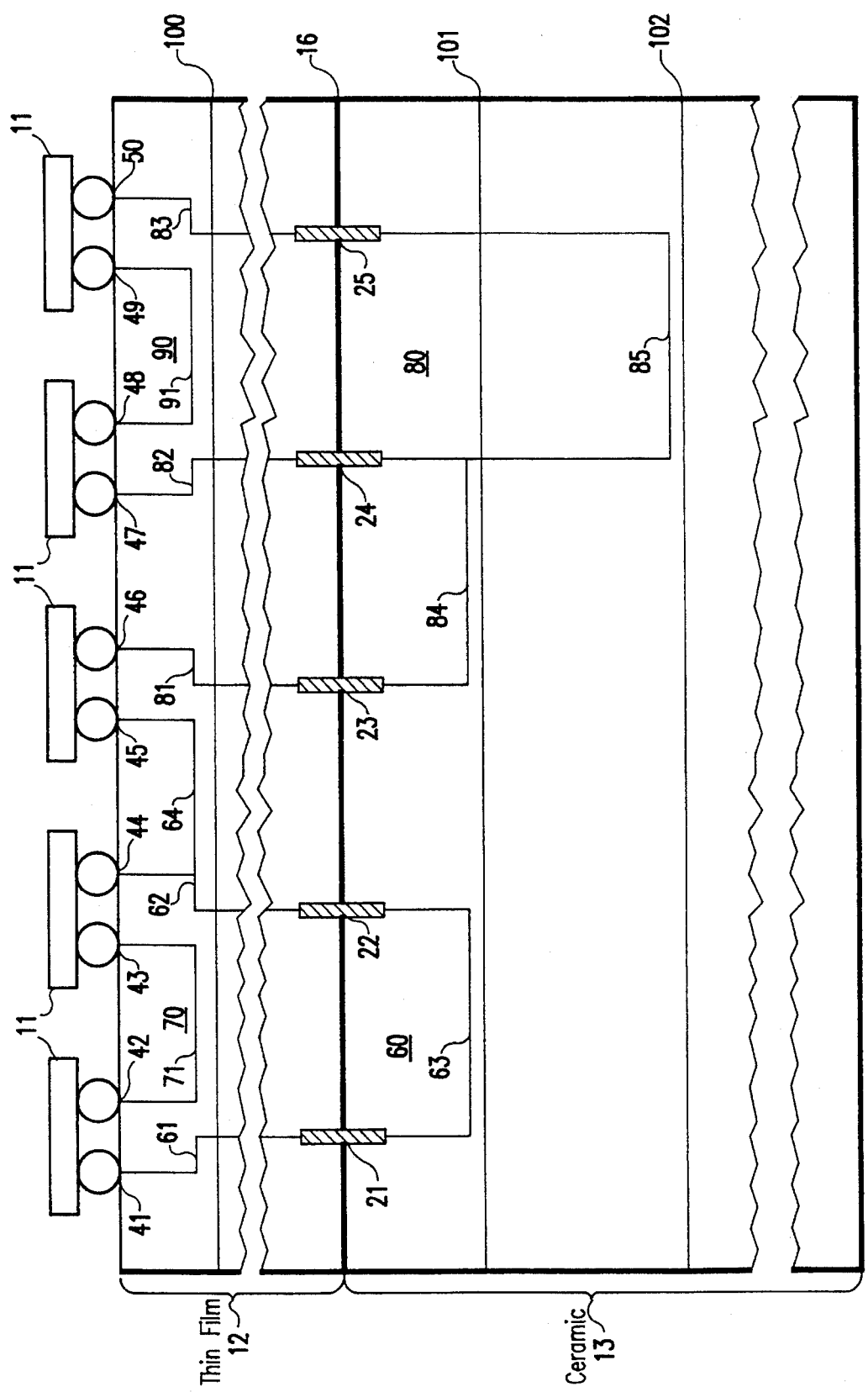

METHOD TO OPTIMIZE THE WIRING OF MULTIPLE WIRING MEDIA PACKAGES

BACKGROUND OF THE INVENTION

1. Field of the Invention

The present invention generally relates to wiring methodologies for electronic packages and more particularly to a method for optimizing the wiring of multiple media wiring packages.

2. Description of the Prior Art

Multi-Chip Modules (MCMs) are becoming increasingly popular as cost effective electronic packages. They have been used in high performance computing for many years, typically in main frame computers; now they are being considered for workstations and personal computers.

There is a trend in the MCM industry to produce packages based on thin film technology. Thin film permits greater density of pins and wiring channels, but is usually expensive. A compromise solution is to use thin film for some of the wiring layers, and a less expensive material, such as ceramic, for the remaining layers. Such packages are usually called hybrid MCMs. In general, packages with more than one wiring medium can be called multiple wiring media packages.

Multiple wiring media packages present new challenges to wiring algorithms and package wiring methodologies. They have several characteristics which need special attention during wiring, including the following:

- the different media used for wiring are very different in their wiring geometries and electrical properties;
- the interface resources which allow connections to go from one medium to another are very scarce; and
- the different electrical properties on different media usually lead to different network models.

For example, resistance must be taken into account in thin film wiring while ceramic wiring must contend with capacitance. These differences mean that certain network topologies which are optimal in ceramic under particular circumstances are not optimal in thin film, and vice versa. Also, ceramic technology requires a wider spacing between pins and fewer wires in wiring channels. This difference in physical scale, coupled with manufacturing limitations for attaching pins to thin film surfaces, significantly reduces the availability of vias between thin film and ceramic layers.

In principle, the characteristics of each medium can be exploited by wiring different types of networks on the different media. However, the prior art discloses no wiring method which effectively integrates the use of multiple network models in a single package composed of multiple media.

Optimizing the wiring of an electronic package is an important step in the design process. A well optimized wiring method helps in reducing the cost of the package, as it leads to a better utilization of the available wiring resources of the package. It also helps in improving the performance characteristics of the package, since smaller wire lengths induce smaller delays in the signal. Several quantities should be optimized during the wiring process, including

- maximize the number of networks wired (this is usually the primary objective since completing all networks defined by the logic of the electronic package is a prerequisite to having a complete wiring design);
- maximize the utilization of wiring resources (the utilization is represented as a percentage of the total wiring capacity that is populated by wires);
- minimize the length of the connections (this leads to better delay performance); and
- minimize the electrical noise (this helps assure the proper functioning of the circuits).

The general problem of optimizing wiring connections between multiple electronic elements each having multiple pins has been addressed in the prior art. For example, U.S. Pat. No. 3,702,004 to Eskew et al. describes a technique for optimally interconnecting elements on a printed circuit board through wiring laid out on both sides of the board by constructing a numbered ordered maze from one pin to another and then backtracking to find the shortest path. More broadly, U.S. Pat. No. 4,500,963 to Smith discloses an automatic layout program for optimizing the wiring of hybrid microcircuits ranging from discrete microcircuits to very large scale integrated circuits. The Smith patent discloses a routing technique which uses multiple wiring layers, under a process which proceeds sequentially from top to bottom or bottom to top using two adjacent layers at a time; within each layer pair iteration, a two phased algorithm operates to (a) establish increasing numerical levels for grid points on the routing surface between source and sink points and then (b) find an optimum path back from the sink point to the source point by proceeding toward decreasing numerical levels in accordance with certain priority rules. Numerical levels of intervening points may be weighted to reflect physical design objectives. The priority rules allow connections between levels through "vias" but promote paths which are in alternative orthogonal directions for alternative layers.

Prior art approaches to optimization do not find it necessary to have a separate medium assignment step nor to deal with wiring constraints at the interfaces between media with significantly different electrical and geometric characteristics. The conventional approach is to route one connection at a time, selecting vias as the router proceeds. If this approach is followed for a multiple wiring media package, a very non-optimal solution will result, as the interface vias will be utilized in a very non-optimal fashion.

For more background related to the invention to be described below, the reader is referred to the books by Kloman, Bernard, and Robert E. Beck, *Elementary Linear Programming with Applications*, Academic Press (1980), Lengauer, Thomas, *Combinational Algorithms for Integrated Circuit Layout*, John Wiley and Sons (1990), and Preas, Bryan T., and Michael J. Lorenzetti, Editors, *Physical Design Automation of VLSI Systems*, The Benjamin/Cummings Publishing Co., Inc. (1988), and the article by Ralph Linsker, entitled "An iterative-improvement penalty-function-driven wire routing system", *IBM Journal of Research and Development*, Vol. 28, No. 5, September 1984, pp. 613–624, all of which are incorporated herein by reference.

SUMMARY OF THE INVENTION

It is therefore an object of the present invention to provide a methodology for wiring optimization where there are multiple wiring media having very different wiring geometries and electrical properties.

It is also an object of the present invention to provide for optimized wiring where there are limited interface resources for connections between different media.

Another object of the invention is to provide for use of different network models for different media.

A further object of the invention is to optimize the utilization of each medium and avoid overuse of each medium.

It is a further object of the invention to perform a global routing across the entire package as a means of providing targets for later steps in the wiring process.

Another object of the invention is to select interface vias globally across the entire package, considering the demands of all the different connections on the package.

A wiring method according to the invention begins by creating data models for the package and for the networks which embody the circuit design logic of the package. These data models represent the design data and the contrasting electrical and geometrical characteristics of the different media in a form suitable for the operation of wiring algorithms. One or more constraint models are associated with each wiring network. The electrical properties and availability limits of all wiring resources are included in the data model.

The data model is then used to select a rough path for each connection and assign networks and portions of networks to particular media. The rough path serves as a basis for estimates of the characteristics of the wiring solution for each network. Network assignments and estimates are made globally, considering the information for other networks and package design constraints incorporated into the data model. In the preferred embodiment of the invention, this step is implemented with a global router of conventional design.

After assignment of media, networks are partitioned into sub-connections to provide for traversal of another medium in order to reach the assigned medium by means of interface vias. Interface vias are controlled by the medium with the coarser geometry. The sub-connections link network pins with interface vias. In the fourth step, interface via selection is optimized through a process whereby each possible combination between network pins needing vias and available vias is evaluated with respect to a set of costs. Estimates made in prior steps are used to generate these costs.

Following via selection, detail routing can be implemented by segmenting the wiring problem into separate problems for each medium. These separate problems can be resolved sequentially in no particular order.

BRIEF DESCRIPTION OF THE DRAWINGS

The foregoing and other objects, aspects and advantages will be better understood from the following detailed description of a preferred embodiment of the invention with reference to the drawings, in which:

FIG. 4 is a simplified cross-sectional representation which expands on FIG. 1 to show how networks are implemented through connections, sub-connections and vias to different media.

DETAILED DESCRIPTION OF A PREFERRED EMBODIMENT OF THE INVENTION

Figure 1:
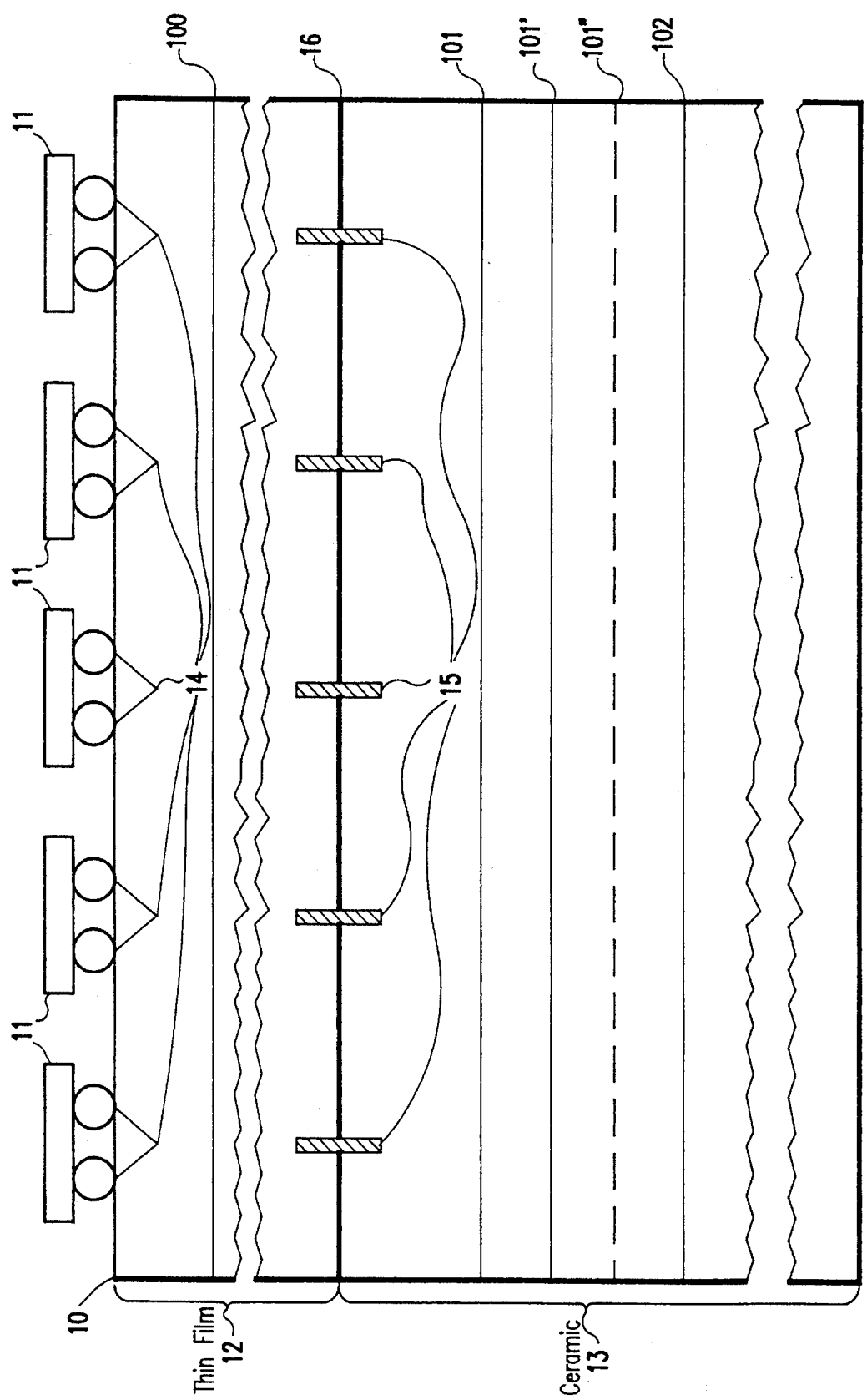
FIG. 1 is a simplified cross-sectional representation of a hybrid multi-chip module.

Referring now to the drawings, and more particularly to FIG. 1, them is shown a simplified representation of a multiple wiring media package 10. The example is simplified for purposes of explanation and not by way of limitation on the invention. Multiple chips 11 having multiple pins 14 are mounted on multiple wiring media comprised of a first (thin film) media 12 and a second (ceramic) media 13 joined at an interface 16. Electrical connections across interface 16 use available interface via channels 15. It is characteristic of multiple media packages that interface 16 supports many fewer interface via channels 15 (five in this example) than pins 14 (ten in this example).

Each wiring media may have multiple wiring layers. In the simplified representation of FIG. 1 there is shown one wiring layer 100 in first (thin film) media 12 and two wiring layers 101 and 102 in second (ceramic) media 13. In accordance with prior an practice, wiring media layers are typically arranged as wiring layer pairs with a voltage reference layer. The predominant direction of wiring on one wiring layer of a pair is orthogonal to the direction of wiring on the other wiring layer. This convention of adjoining plane pairs of wiring layers facilitates efficient use of wiring resources for implementing a set of networks whose pins are spread out over the area covered by multiple chips 11. A voltage reference layer provides power and serves to shield signals in one plane pair from interference from signals in another plane pair. In FIG. 1 there is shown for purposes of illustration only one example of a plane pair (wiring layers 101 and 101') and a voltage reference layer 101". Typically, wiring layers 100 and 102 would also be part of plane pairs.

The logic of package 10 requires electrical connections between pins in four networks, as shown in FIG. 4: pins 41, 44 and 45 form one network 60; pins 42 and 43 form a second network 70; pins 46, 47 and 50 form a third network 80; and pins 48 and 49 comprise the fourth network 90. Electrical connections between media are provided by vias 21 to 25.

Figure 2:
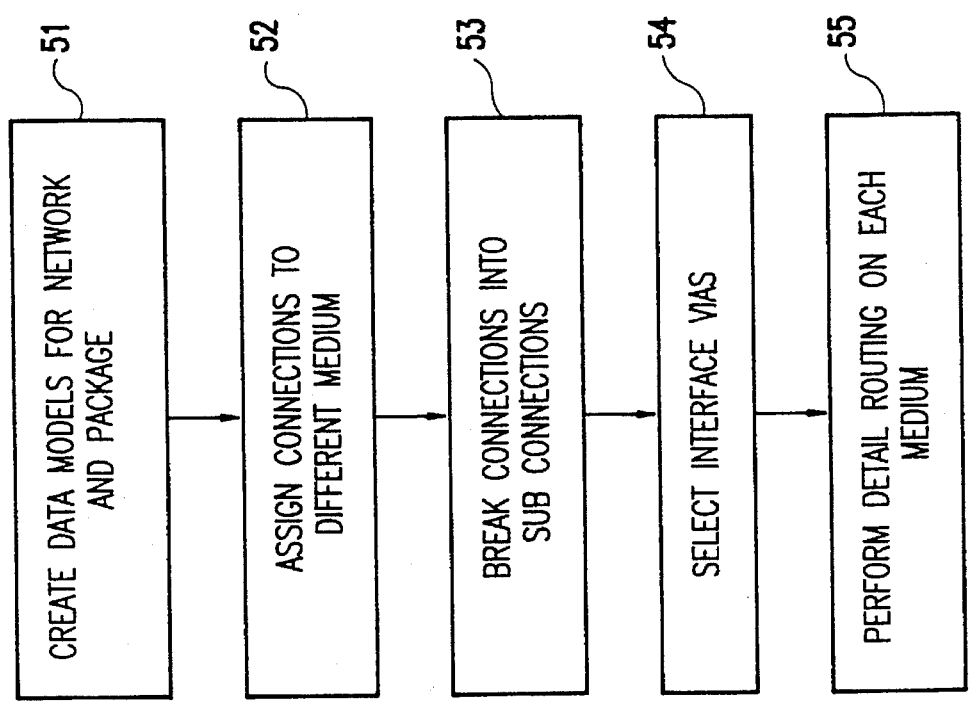
FIG. 2 is a flow diagram showing steps in a method to optimize the wiring of packages with multiple wiring media.

Our solution to solving the wiring problem is a method outlined in the flow diagram of FIG. 2. The different steps of this method are described in more detail below.

Create Data Models for the Design and Technology Data

The technology and design data need to be represented in a form suitable for wiring algorithms. This step 51 in FIG. 2 is essential to all wiring algorithms. In this step, a computer model is created for all the essential technology and design data.

Different media have different electrical and geometrical characteristics. For example, thin film is usually very resistive and the physical dimensions are line relative to ceramic, with wire pitches on the order of tens of microns. By contrast, ceramic is not resistive but is subject to capacitive losses and has physical dimensions which are coarse relative to thin film, with wire pitches on the order of hundreds of microns. A package can be composed of parts which differ in their electrical and geometrical characteristics. The illustrations in FIG. 1 and FIG. 4 show these parts as media layers 12 and 13, but the present invention also operates to optimize wiring where areas within a horizontal layer have differing characteristics and these characteristics are defined in a data model.

A package can be divided into layers, which in practice most often occur as plane pairs separated from other plane pairs by a voltage or reference layer. For the purposes of illustration, and not by way of limitation, FIG. 4 shows a thin film wiring layer 100 and two ceramic wiring layers 101 and 102. In a preferred embodiment each of the wiring layers are component layers in respective plane pairs of layers.

In order to implement a package wiring strategy it is necessary to make connections between different media. These connections are called interface vias 21 to 25, as shown in FIG. 4. The availability of interface vias is limited by the coarser medium, which in the example is ceramic. A potential consequence of the physical differences between two media is that the number of interface vias may be far fewer than the number of pins. In the illustration shown in FIG. 4 there are ten pins 41 to 50 and only five interface vias 21 to 25. In accordance with the invention, this limitation must be considered when implementing networks in the coarser medium.

Figure 3C:
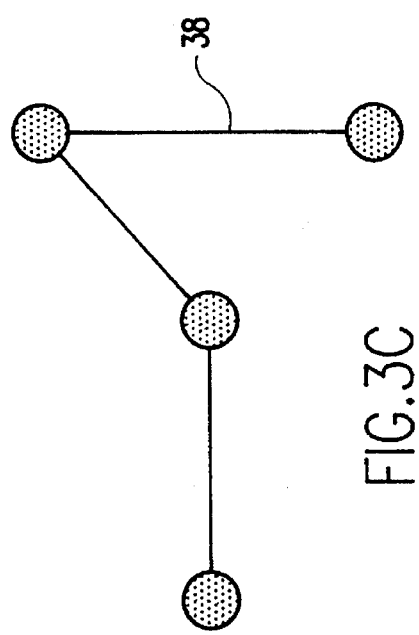
FIGS. 3B and 3C show alternative connection structures for implementing the network.
Figure 3B:
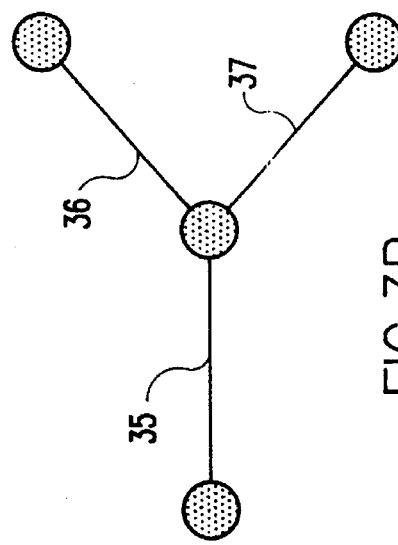
Figure 3A:
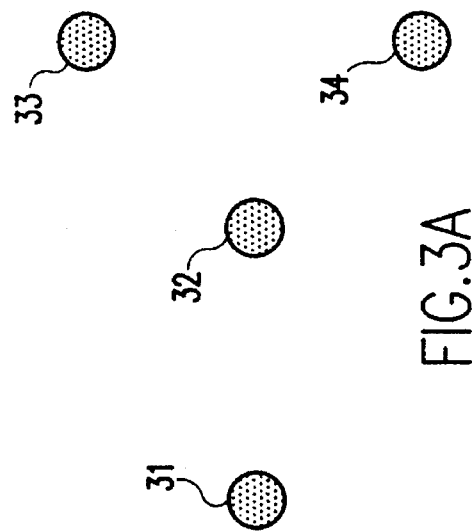
FIG. 3A shows an illustrative layout of pins which are to be connected in a network.

The design data describe the networks and the interconnections within each network. A network is a set of pins that are electrically connected together. In MCMs, networks are usually modeled as transmission lines. In this environment, the topology of the network needs to be controlled. This is done by breaking a network into connections. A connection represents two pins that have to be wired together. The relationship between networks and connections is illustrated in FIGS. 3A, 3B and 3C. FIG. 3A shows a network consisting of pins 31, 32, 33, and 34 which must be electrically connected in accordance with the logic of package 10. FIGS. 3B and 3C show two different connection topologies for the network, a cluster topology and a daisy chain topology, respectively.

In accordance with the best mode for practicing the invention, each network is associated with one or more network constraint models. A network constraint model will specify several parameters. One of these parameters will be a topology for the network, as illustrated by the cluster of FIG. 3B or the daisy chain of FIG. 3C. Additionally, a network constraint model will specify a set of measure limits, such as the maximum length of the transmission line between two pins and the maximum capacitance at a pin. Furthermore, a network constraint model will establish a medium in which the network or a portion of the network is to be implemented. Multiple network constraint models for the same network are evaluated during practice of the invention and ultimately one model is selected which, in combination with similar selections for other networks, results in optimal wiring for the whole wiring package. In the absence of network constraint models, practice of the invention requires considerable computing resources to dynamically establish network parameters.

In addition to multiple alternative sets of constraints applicable to each network, practice of the invention permits establishment within the data model of overall package constraints such as wiring media to be used, the number of wiring layers or planes, available wiring tracks for each layer, a description of the vias provided for interconnection between layers, maximum package depth, inter-network signal timing, and package-wide noise limits. The electrical properties of all wiring resources are included in the data model. Also, manufacturing constraints limit the availability of wiring resources.

Assignment to Wiring Mediums; Estimation

In step 52 shown in FIG. 2, each network or portion of a network is assigned to a wiring medium, based on the characteristics that are required for the connection and the available resources of the medium. A rough path for each connection is selected, and this selection is used to estimate the characteristics of the wiring solution for each network. These estimates include such items as designation of the layer to be used by the network within its assigned medium, the length of connections, noise levels, and designation of target interface vias. These estimates are used to optimize the solution in succeeding steps. In the preferred embodiment, network assignments are made globally, in light of a package-wide consideration of the constraints of the technology and design. Preferably, this is accomplished using a global router of conventional design.

For example, thin film is usually faster than ceramic; so some connections which need higher signal speed are assigned to the thin film. Many different criteria can be used to assign connections to different media, within the overall constraint that the wiring capacity of each part of each media may not be exceeded. It is important to optimize the medium selection so that the favorable electrical characteristics of each medium are fully exploited in relation to the desired properties for the network. Also, in the preferred embodiment, each net should be able to be implemented within the constraints of at least one of its constraint models. Specific layer designations within an assigned medium for each connection on a network are estimated, which helps in later optimizing steps; e.g., obtaining better capacitance targets for optimizing certain sub-connections. In addition, consideration is given to inter-network and package level parameters, such as timing and noise, which affect the quality of the final solution.

The results of this step are illustrated in FIG. 4. Networks 70 and 90 are to implemented in thin film. Network 80 is to be implemented in ceramic. Network 60 is implemented partially in ceramic (pin 41 to pin 44) and partially in thin film (pin 44 to pin 45).

Partition Each Network into Sub-connections

As described earlier in step 52, a network is broken up into connections and these connections are assigned to a medium. In some cases, as illustrated by networks 70 and 90 in FIG. 4, the networks' connections (connection 71 between pin 42 and pin 43 in network 70, and connection 91 between pin 48 and pin 49 in network 90) will be assigned to first medium (thin film) 12 and will not require implementation in another medium. However, this will not be the case where one or more connections have been assigned to second medium (ceramic) 13. In order to reach its assigned medium a portion of the network may be required to travel through another medium. Such networks are modelled as a list of the original pins augmented by a list of interface vias which will be used to access their assigned medium.

In step 53 these networks are partitioned by the addition of subconnections for linking pins to interface vias. In FIG. 4, for example, subconnections 61 and 62 are required in first media (thin film) 12 in order to provide pin-to-via continuity for connection 63 which has been assigned to second media (ceramic). Similarly, connection 84 requires subconnections 81 and 82, and connection 85 requires subconnection 82 and 83. The interface vias complete the continuity link.

It is important to recognize that in general the interface vias have only been estimated at this point in the process, and definitive continuity will not be established until the subsequent steps of interface via selection and detail routing. However, for high performance designs it is not uncommon for implementation constraints to force explicit designation of subconnections and vias for critical networks at this earlier step.

Select Interface Vias

Step 54 in FIG. 2 is a very important step in the wiring of multiple wiring media packages in accordance with the invention. The interface vias 21 to 25 are used to go between different media, as shown in FIG. 4. Since the different media typically have different wiring geometries, the positions at which interface vias can occur are controlled by the medium with the coarser geometry. For example, the ceramic may support interface vias requiring twice the spacing of pins in the thin film. These interface vias are used primarily for carrying signals and for supplying power. The signal interface vias are a relatively scarce wiring resource.

In accordance with the invention, all the connections and corresponding sub-connections are considered together. In the preferred embodiment of the invention, a conventional algorithm, such as the Hungarian method, is used to resolve the assignment problem. This method considers all the connections together, rather than one connection at a time. The final solution is optimal with respect to a set of costs which are associated with each potential sub-connection. Each potential sub-connection consists of a pin and a proposed interface via. A cost considers such quantities as noise through vias, length between the pin and its proposed interface via, the length of the wire between an interface via and other interface vias which are connected to it, the wireability of the sub-connection, and the capacitance of the interface via and the wire connecting it to its pin. The estimates that were made earlier provide a basis for assigning a cost to each potential subconnection, notwithstanding that some component quantities are dependent upon the final implementation of the network owning the pins or on the relationships between different elements of the same network or on the implementation of other networks.

In the example shown in FIG. 4, costs are determined for each of the five pins 41, 44, 46, 47, and 50 in combination with each of the five interface vias 21 to 25 for a total of twenty-five cost determinations. From these twenty-five, a set of five assignments will be made.

Perform Detail Routing Within Each Medium

The final step 55 completes the actual detailed wiring of each layer. Since the interface vias were assigned in the previous step, the original wiring problem can more readily be broken into separate wiring problems, each associated with a specific wiring medium. The solutions to these problems are arrived at sequentially in no particular order. Finding a wiring solution for each medium can be broken down into the following steps:

1. Plan the layout of the different connections and sub-connections for the selected medium. This layout is not a final designation of paths, but is on a freer grid than prior assignments. Furthermore, an attempt is made to resolve congestion problems local to any area in the medium and to refine estimates needed for further optimizations. In performing this step, previously compiled estimates are used to evaluate situations where the implementation of a subconnection in the chosen medium is dependent upon the implementation of a related part in a different medium. For example, if the layer assignment of sub-connection 85 in FIG. 4 is constrained by a capacitance limit on the sum of the capacitances of the via column at interface via 25 and sub-connection 83, the most current estimate of the implementation of sub-connection 83 is important to obtaining a reasonable solution.

2. Generate detailed paths for all connections and subconnections. Usually, an attempt is made to follow paths laid out during the preceding step. If it is not possible to follow this path, alternatives are attempted. It is not until this step that definitive continuity is established between pin pairs. That continuity is illustrated by network 80 in FIG. 4, where the network is composed of connection 84 between pins 46 and 47 and connection 85 between pins 47 and 50. Subconnection 81 in wiring layer 100 of first medium (thin film) 12 connects pin 46 with via 23, connection 84 in layer 101 of second medium (ceramic) 13 extends from via 23 to via 24, and subconnection 82 in wiring layer 100 of first medium (thin film) 12 connects via 24 with pin 47. The second connection between pins 47 and 50 is implemented in similar fashion through subconnection 82 in thin film wiring layer 100, via 24, connection 85 in ceramic wiring layer 102, via 25, and subconnection 83 in thin film wiring layer 100.

In the preferred embodiment of the invention there are up to two plane pairs of thin film wiring and up to twenty-five plane pairs of glass ceramic wiring. FIG. 4 omits illustration of wiring layer pair 101' (shown in FIG. 1) because that wiring layer is not necessary for implementing the networks shown in the simplified representation. Voltage reference layer 101" (shown in FIG. 1) is omitted because voltage reference layers do not constrain solution of the wiring geometry problem; however, the presence of voltage reference layers is accounted for in the data model of step 51 and is reflected in estimates of the impedance between connections on different sides of the voltage reference layers.

The invention described herein can be implemented in other design systems, such as boards or cards having different geometric or electrical characteristics on different wiring layers. It is not necessary that the different wiring layers be constructed of different material; the method is applicable and beneficial whenever the different wiring layers have different geometric or electrical properties. Those skilled in the art will recognize that the invention can be practiced with modification within the spirit and scope of the appended claims.

Having thus described our invention, what we claim as new and desire to secure by Letters Patent is as follows:

1. A method of optimizing the wiring of multi-chip modules using multiple wiring media comprising the steps of:

inputting data models for a network composed of multiple chips and the multiple wiring media, said wiring media having differing electrical and geometric characteristics, a data model for the multiple wiring media including a limited number of interface vias making connections between different media of the multiple wiring media;

assigning connections to different media of the package based on characteristics and constraints required for connections and available resources of the media using a global router to establish estimates for each connection;

breaking connections into sub-connections for portions of the network required to pass from one medium through another medium by modeling those portions of the network as a list of original pins of the multiple chips augmented by a list of interface vias, each potential sub-connection consisting of a paired network pin and interface via;

associating a cost with each potential interface via and sub-connection, said cost considering the demands of said characteristics and constraints across said package;

selecting interface vias to resolve assignment problems by considering all connections together; and performing detailed routing on each media of the package based on the selection of interface vias.

2. The method of claim 1 further comprising the step of associating a data model for the network with one or more network constraint models specifying topology of the network, a wiring medium in which the network or a portion of the network is to be implemented, and measure limits.

3. The method of claim 2 wherein alternative constraint models are provided for the network, each constraint model having a topology representing said network as a set of connections between pairs of pins, each said alternative constraint model further having measure limits and designating wiring media in which said network is to be implemented.

4. A method of optimizing a multiple wiring media package, said package comprising multiple electronic components mounted on wiring media forming electronic networks defined by a multiplicity of electronically active pins, said wiring media being composed of two or more parts each having different electrical and geometrical characteristics, said parts being joined physically at one or more interfaces and being joined electronically through said interfaces by a a limited number of interface vias, said electronic networks being implemented in a multiplicity of connections interconnecting said pins, a design of said electronic network further imposing a set of electrical and geometrical constraints upon said package and said connections, said method comprising the steps of:

representing said multiple wiring media characteristics and said electrical and geometrical constraints in data models;

constructing estimates of a complete wiring solution using a global routing algorithm based on the data models;

assigning said connections to different media of said multiple wiring, media in a manner consistent with the constraints in the data models;

partitioning said network connections by adding a sub-connection and interface via for each network pin which is part of said network connection having been assigned to a media not directly accessible by said pin, each potential sub-connection consisting of a paired network pin and interface via;

associating a cost with each potential combination of available interface via and said sub-connection, said cost considering the demands of said characteristics and said constraints across said package, said cost being based upon said estimates of remaining elements;

selecting said interface vias in a manner that reflects network connections and constraints and minimizes costs; and performing detail routing based on the selection of interface vias, said detail routing being performed for each said part sequentially.

5. The method of claim 4 wherein the step of representing electrical and geometrical constraints in data models includes as parameters of a network constraint model a topology for the network, a wiring medium in which the network or a portion of the network is to be implemented, and a set of measure limits.

6. The method of claim 5 wherein said data models provide for alternative constraint models for each of said networks, each said alternative constraint model having a topology representing said network as a set of connections between pairs of said pins, each said constraint model further having a set of measure limits and designating wiring media in which said network is to be implemented.

7. A method for optimizing the wiring of a multiple wiring media package comprising multiple electronic components forming electronic networks, comprising the steps of:

inputting data models representing a multiple wiring media package, network connections and constraints of a design of said electronic networks, said multiple wiring media having differing electrical and geometric characteristics, said multiple wiring media further being joined physically at one or more interfaces including a limited number of interface vias;

constructing estimates of a complete wiring solution using a global routing algorithm based on the input data models;

assigning said network connections to different media of said multiple wiring media in a manner consistent with constraints of a design of said electronic networks;

partitioning said network connections by adding a sub-connection and interface via for each network pin which is part of a network connection having been assigned to a media not directly accessible by said pin, each potential sub-connection consisting of a paired network pin and interface via;

associating a cost with each potential interface via and sub-connection, said cost considering the demands of said characteristics and said constraints across said package;

selecting said interface vias in a manner that reflects network connections and constraints and minimizes costs; and performing detail routing for each media sequentially based on the selection of interface vias.

8. The method of claim 7 wherein the step of inputting data models includes as parameters of a network constraint model a topology for the network, a wiring medium in which the network or a portion of the network is to be implemented, and a set of measure limits.

9. The method of claim 8 wherein said data models provide for alternative constraint models for said network, each said constraint model having a topology representing said network as a set of connections between pairs of said pins, each said alternative constraint model further having a set of measure limits and designating wiring media in which said network is to be implemented.

* * * * *